(12) United States Patent
Le Neel et al.

(10) Patent No.: US 9,018,723 B2
(45) Date of Patent: Apr. 28, 2015

(54) INFRARED CAMERA SENSOR

(71) Applicant: STMicroelectronics Pte Ltd, Singapore (SG)

(72) Inventors: Olivier Le Neel, Singapore (SG); Ravi Shankar, Singapore (SG); Tien Choy Loh, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 13/929,610

(22) Filed: Jun. 27, 2013

(65) Prior Publication Data

US 2015/0001659 A1    Jan. 1, 2015

(51) Int. Cl.

| H01L 31/0232 | (2014.01) |
| H01L 29/84 | (2006.01) |
| H01L 27/14 | (2006.01) |
| H01L 27/146 | (2006.01) |

(52) U.S. Cl.
CPC .... *H01L 27/14629* (2013.01); *H01L 27/14685* (2013.01); *H01L 2924/1461* (2013.01)

(58) Field of Classification Search
CPC .................. H01L 27/14629; H01L 2924/1461
USPC ........... 257/415, 428, 431, 432, 444, E31.093
See application file for complete search history.

(56) References Cited

U.S. PATENT DOCUMENTS

| 5,589,689 | A | * | 12/1996 | Koskinen ................. 250/339.01 |
| 7,002,441 | B2 | * | 2/2006 | Pillans et al. .................... 335/78 |
| 7,026,184 | B2 | * | 4/2006 | Xie et al. ......................... 438/48 |
| 7,105,358 | B2 | * | 9/2006 | Majumdar et al. ............ 436/518 |
| 7,172,921 | B2 | * | 2/2007 | Yang et al. ....................... 438/66 |
| 7,390,687 | B2 | * | 6/2008 | Boettiger et al. ............... 438/64 |
| 7,397,066 | B2 | * | 7/2008 | Oliver .............................. 257/81 |
| 7,933,428 | B2 | * | 4/2011 | Sawada ......................... 381/357 |
| 8,368,153 | B2 | * | 2/2013 | Huang et al. ................... 257/416 |
| 8,400,257 | B2 | | 3/2013 | Lim et al. |
| 8,436,426 | B2 | | 5/2013 | Le Neel et al. |
| 8,513,606 | B2 | * | 8/2013 | Oda ........................ 250/339.04 |
| 8,525,389 | B2 | * | 9/2013 | Tan et al. ....................... 310/328 |
| 8,860,154 | B2 | * | 10/2014 | Wang ............................. 257/416 |
| 8,927,934 | B2 | * | 1/2015 | Noguchi .................... 250/338.3 |
| 2012/0161003 | A1 | * | 6/2012 | Tsuchiya .................... 250/338.3 |
| 2013/0023063 | A1 | * | 1/2013 | Matsushima et al. ............. 438/3 |
| 2014/0264712 | A1 | * | 9/2014 | Boutami et al. ............... 257/467 |

* cited by examiner

*Primary Examiner* — Ida M Soward
(74) *Attorney, Agent, or Firm* — Seed IP Law Group PLLC

(57) ABSTRACT

The present disclosure is directed to an infrared sensor that includes a plurality of pairs of support structures positioned on the substrate, each pair including a first support structure adjacent to a second support structure. The sensor includes plurality of pixels, where each pixel is associated with one of the pairs of support structures. Each pixel includes a first infrared reflector layer on the substrate between the first and the second support structures, a membrane formed on the first and second support structures, a thermally conductive resistive layer on the membrane and positioned above the first infrared reflector layer, a second infrared reflector layer on the resistive layer, and an infrared absorption layer on the second infrared reflector layer.

10 Claims, 15 Drawing Sheets

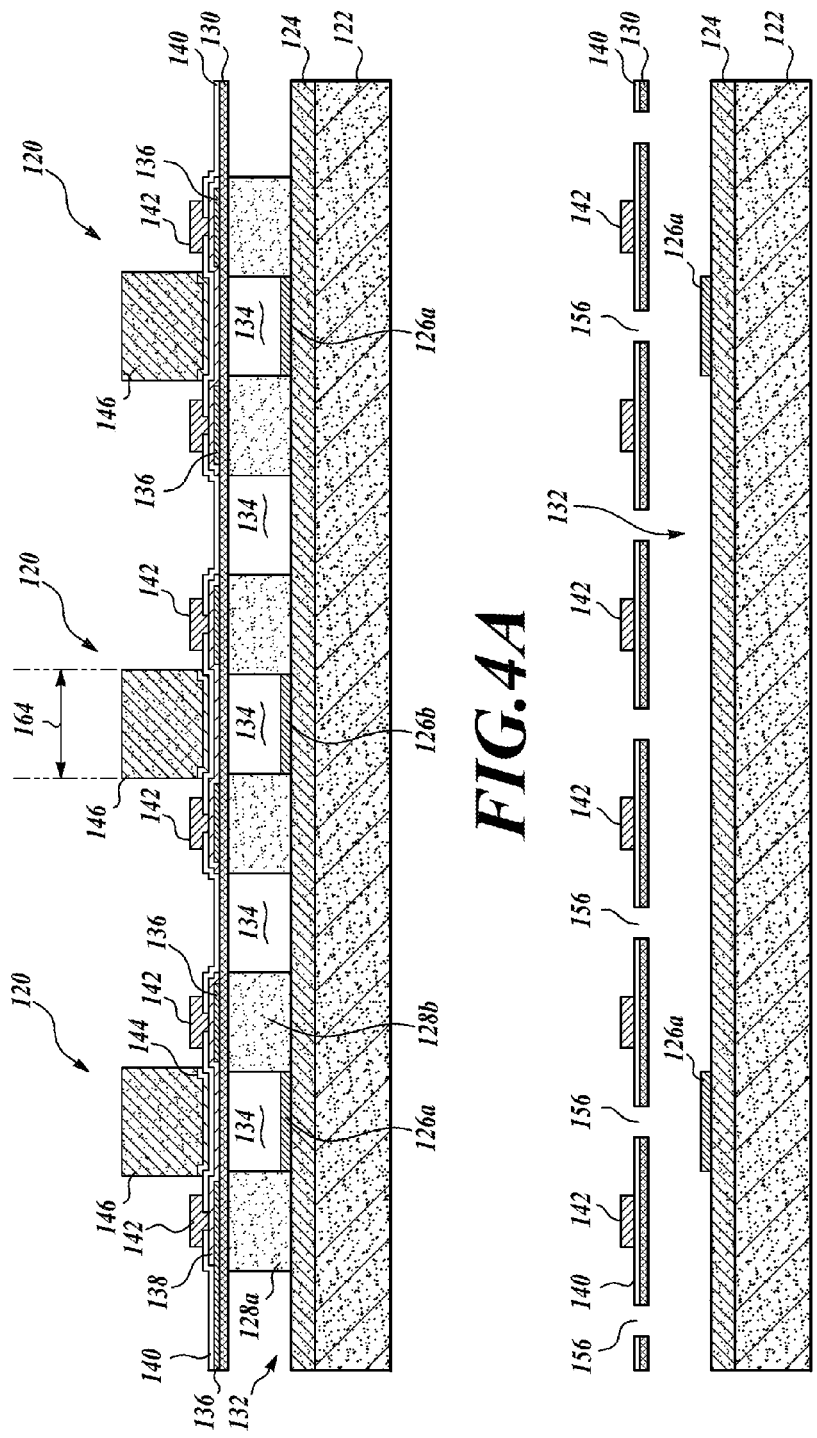

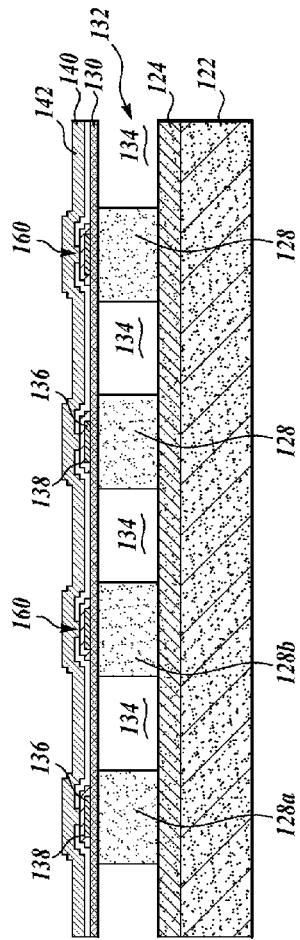
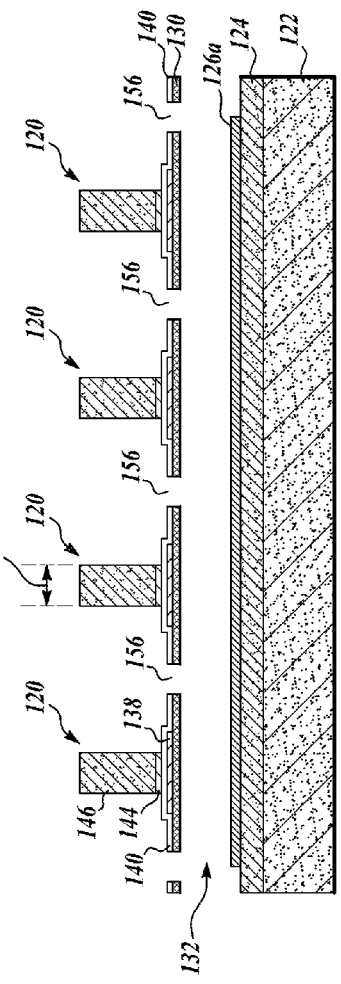
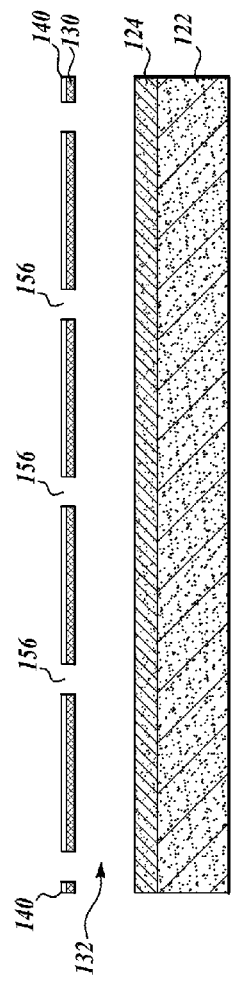
FIG.4C
FIG.4D
FIG.4E

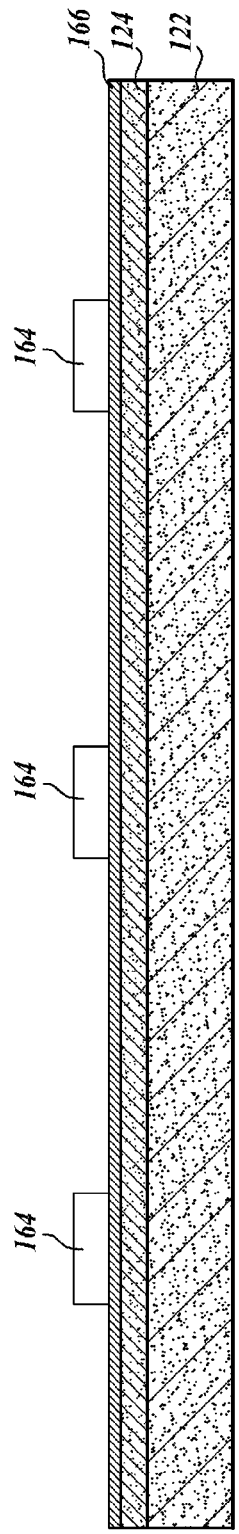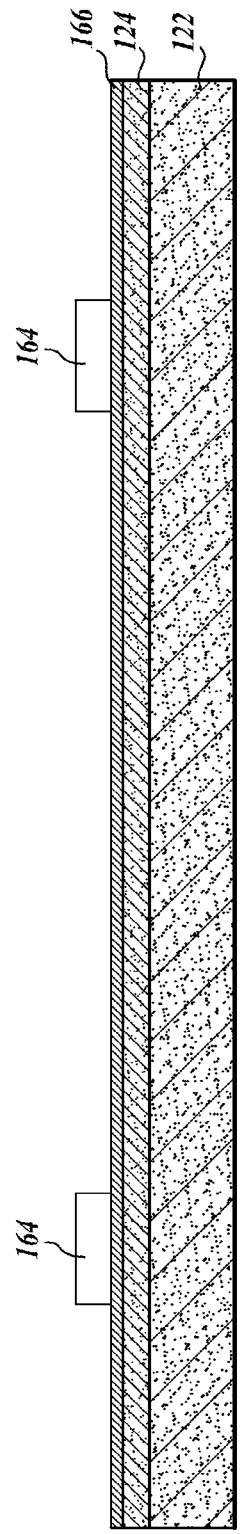

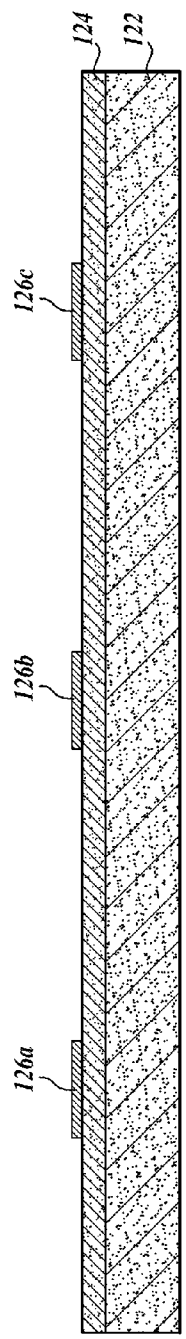
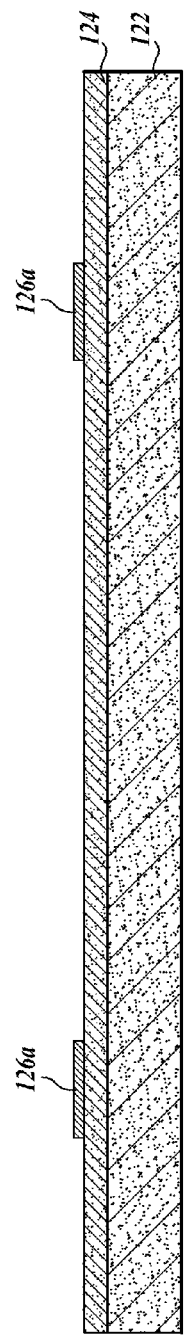
FIG.6A
FIG.6B

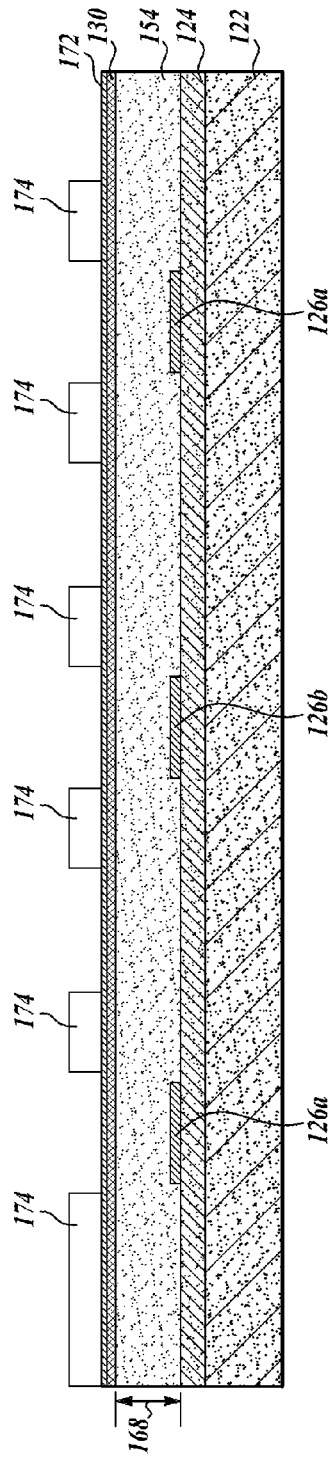
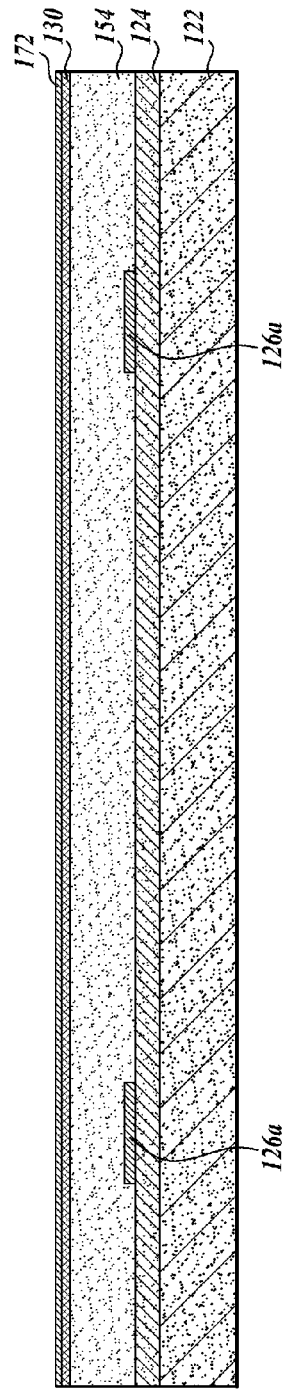

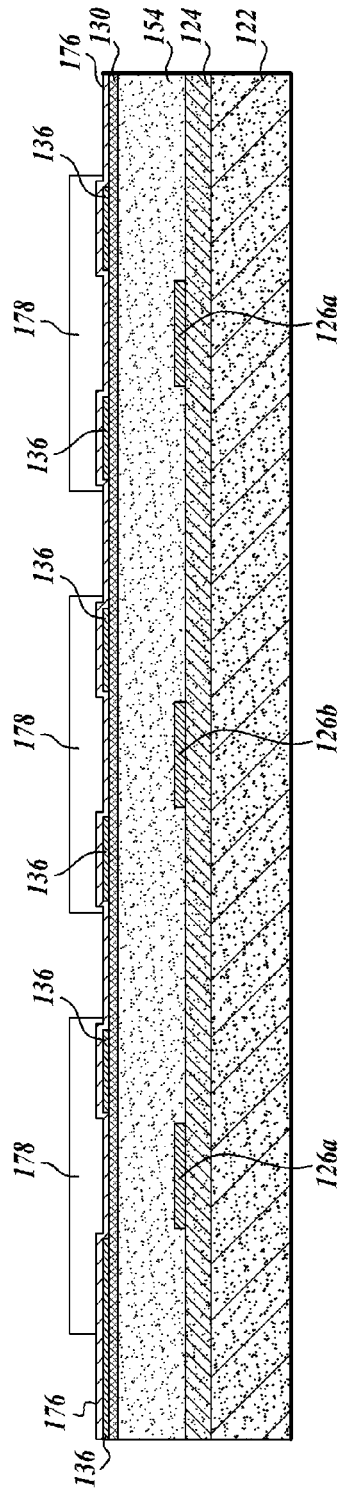
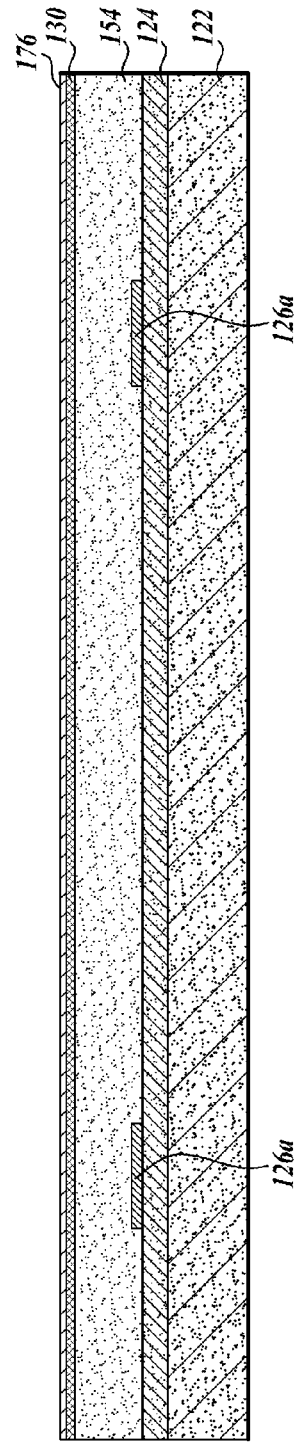
FIG.8A
FIG.8B

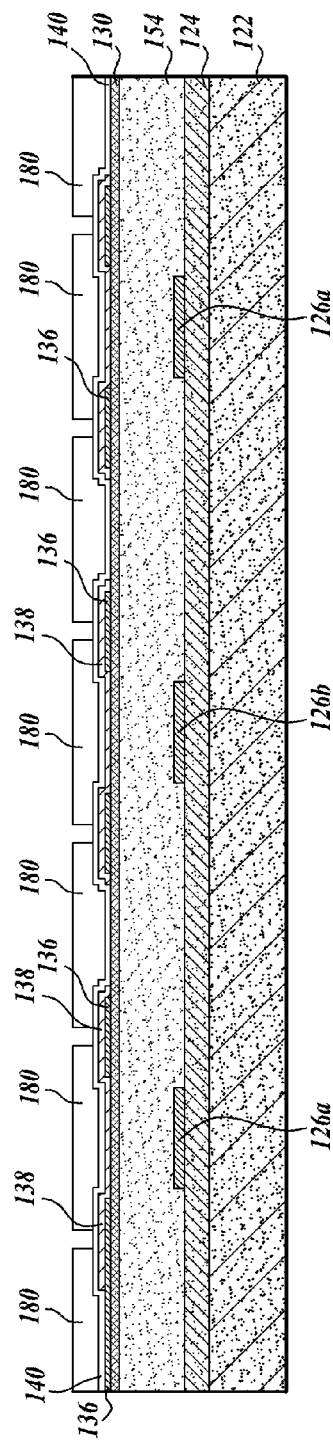
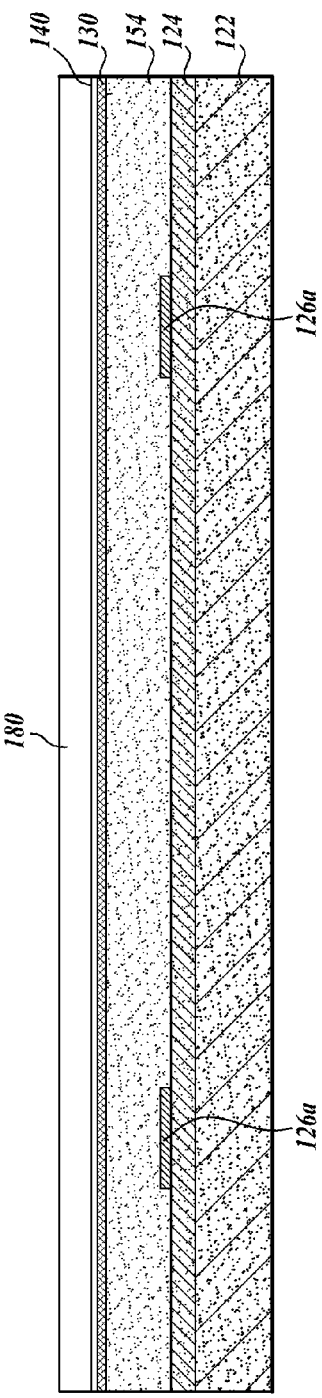
FIG.9A
FIG.9B

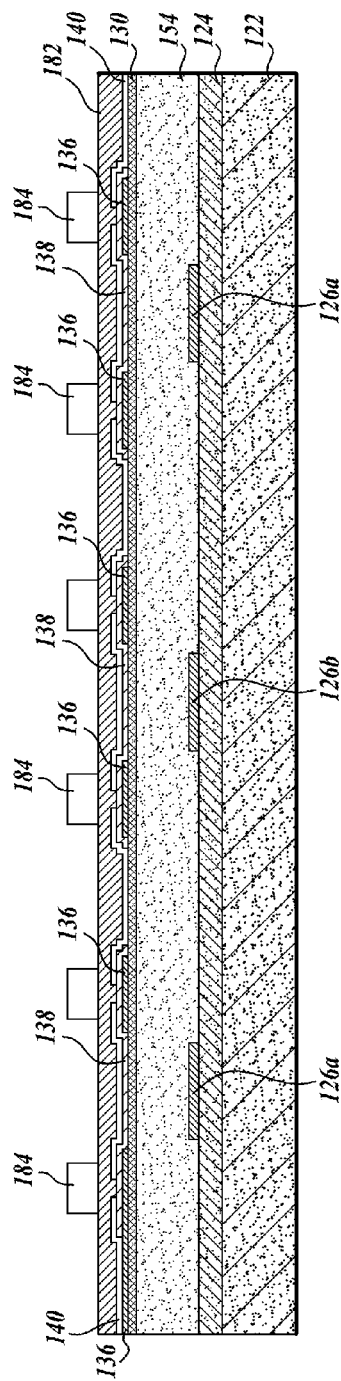
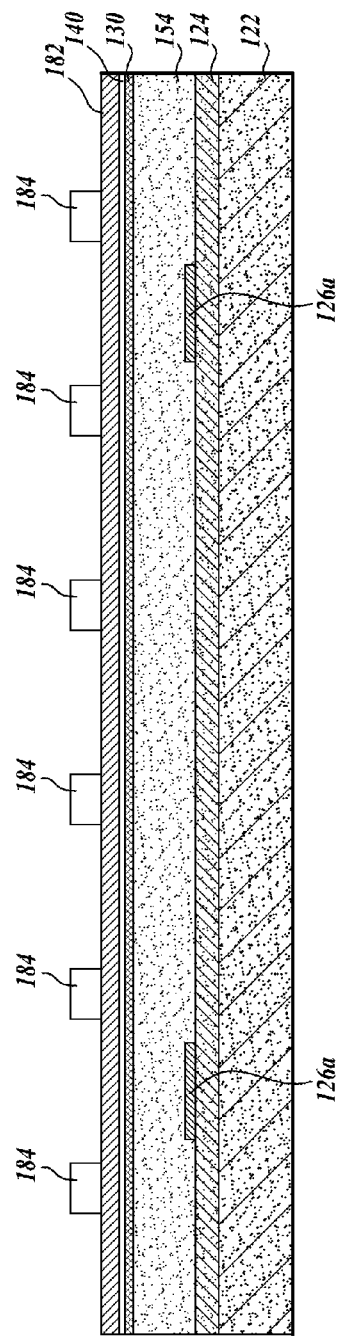

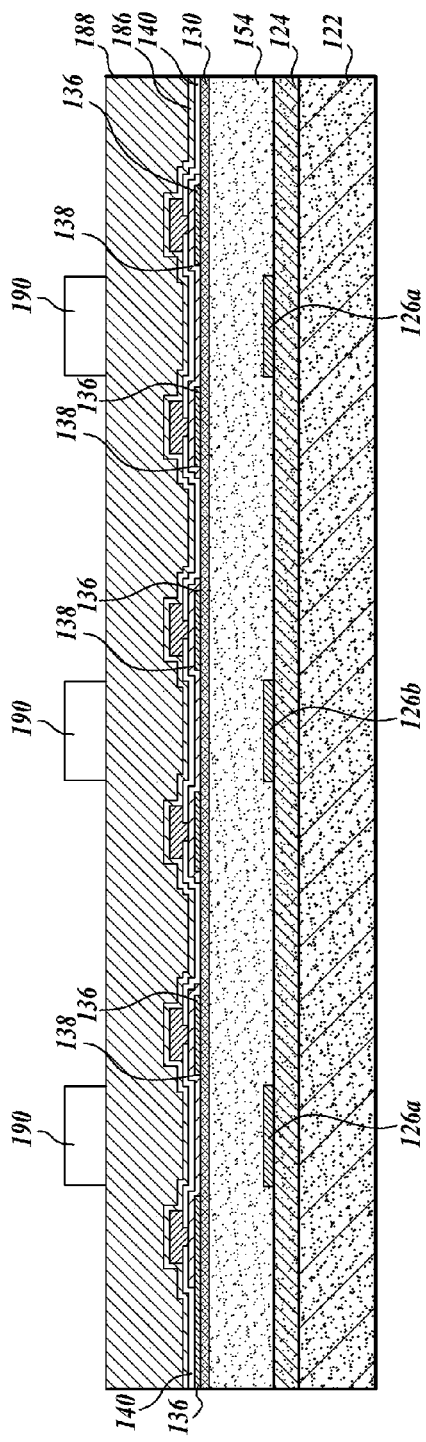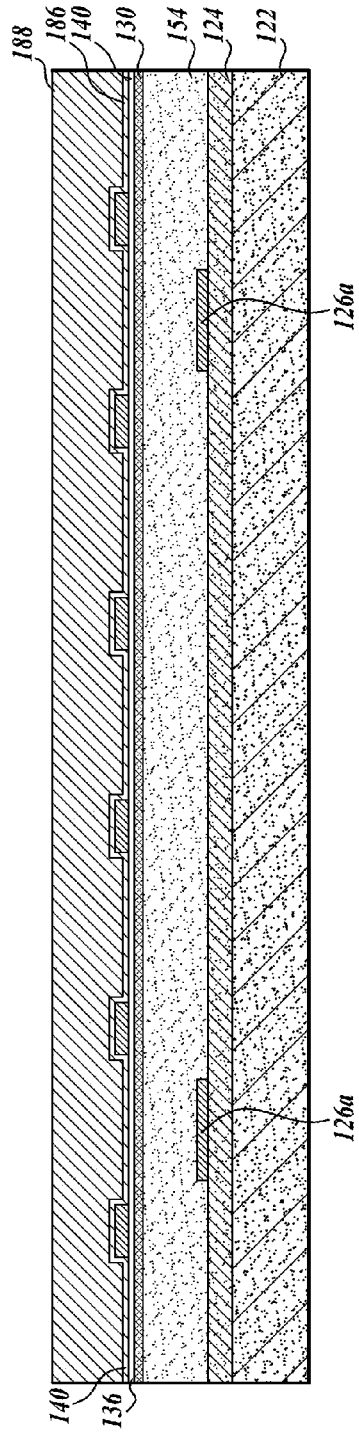

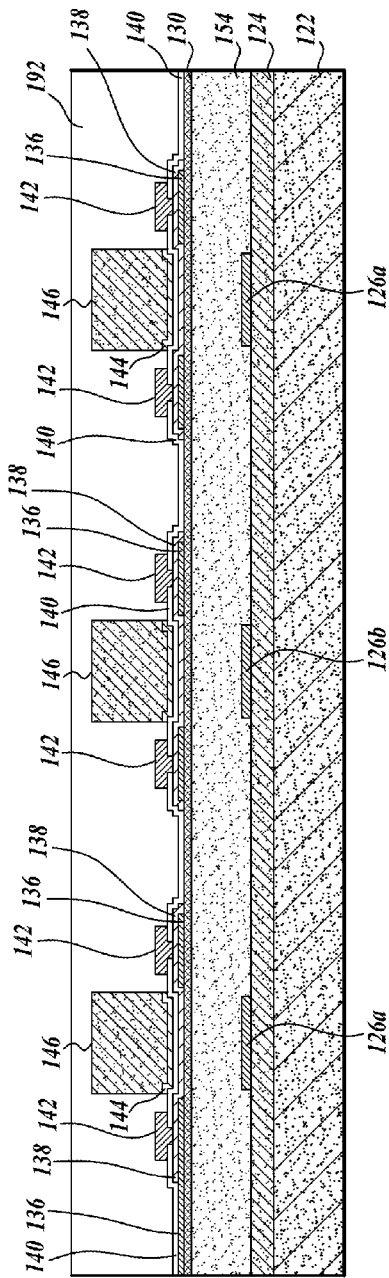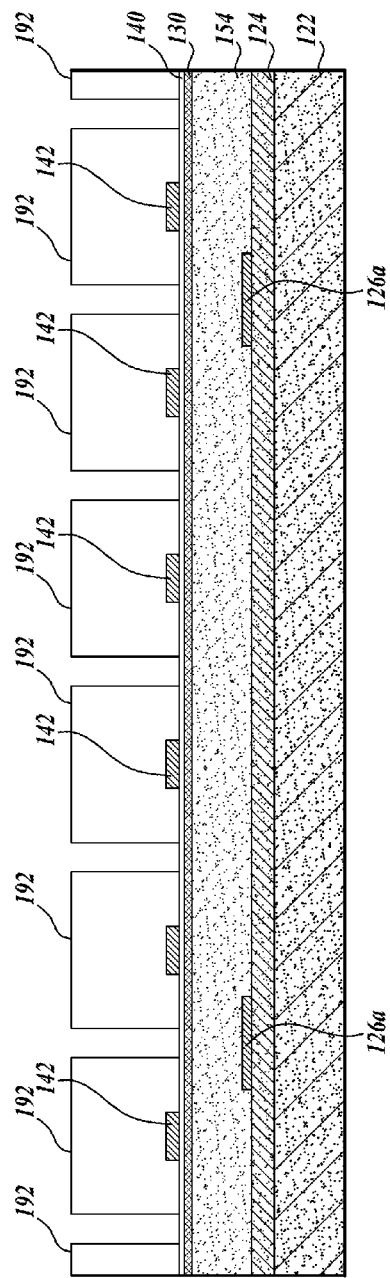

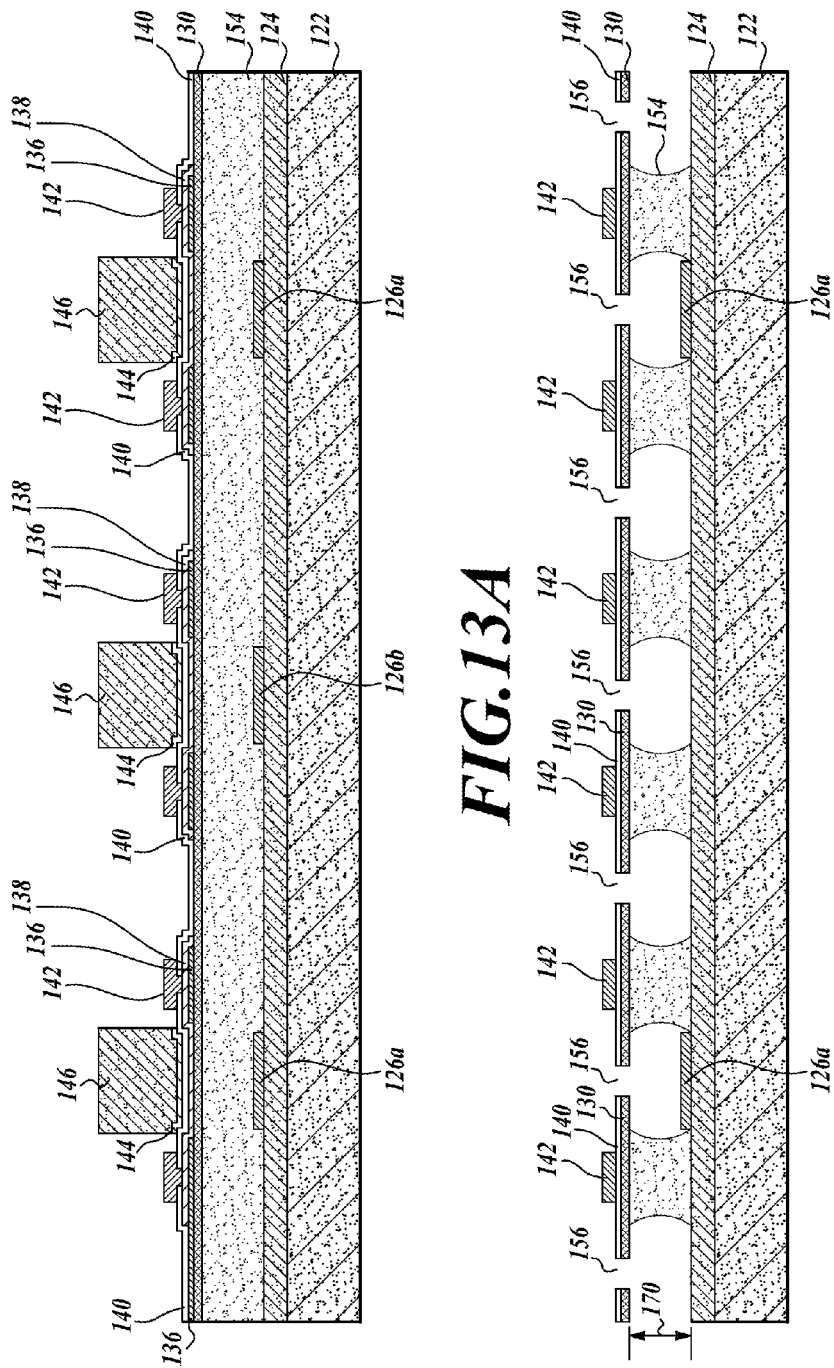

INFRARED CAMERA SENSOR

BACKGROUND

1. Technical Field

The present disclosure is directed to a camera sensor module, and more particularly to an array of high-resolution infrared pixels having a reduced pitch between the pixels.

2. Description of the Related Art

Current infrared sensors are widely used in a variety of commercial and governmental applications. For example, infrared sensors detect a presence of a person in a room by detecting temperature changes, such as when a person enters a room. This is a relatively simple detection that can be achieved with a couple of pixels that have a 300 micrometer pixel pitch. Other infrared sensors detect body temperature measurements and can be used for thermal imaging, such as thermography. Body temperature measurements can be achieved with low resolution sensors, e.g., a 200 pixel sensor with 100 micrometer pixel pitch.

There are many commercial applications of infrared sensors, such as technicians identifying overheating joints or sections of power lines, which can be a sign of impending failure of the line. These sensors can help identify heat leaks in thermal insulation, which can result in making buildings and homes more energy efficient.

Infrared sensors detect radiation in the infrared range of the electromagnetic spectrum, which ranges from 750 nanometers to 1.0 millimeters (0.75 to 1000 micrometers). All objects emit infrared radiation, which means that images of an environment can be created with or without illumination from the visible range. The amount of radiation emitted by an object increases with temperature, which allows an infrared sensor to detect subtle variations in temperature.

Thermal imaging cameras provide images where warmer objects stand out against cooler backgrounds and background objects. For example, living beings are easily visible with an infrared sensor even without light from the visible spectrum. Higher resolution infrared sensors, like these, are useful in automotive safety, such as providing video imaging showing living beings during the night or other low light conditions. These are medium resolution sensors having approximately 2000 pixels with 25 micrometer pixel pitch.

Bolometers are infrared sensors that detect incident electromagnetic radiation by heating a material that has a temperature dependent electrical resistance. An increase in temperature is used to measure a radiant energy. Microbolometers, such as the microbolometer 100 in FIG. 1, are bolometers that can be used as a detector in a thermal camera to detect infrared radiation. The microbolometer 100 includes an infrared absorbing material 102 suspended above a substrate 106. When a photon strikes the absorbing material 102, the photon passes through the absorbing material 102 hits a reflector 104 and bounces back up through the absorbing material 102. The absorbing material increases in temperature as the number of photons passing through the absorbing material increases. The change in temperature provides the data read out by circuitry in the substrate.

BRIEF SUMMARY

As the number of pixels in an infrared sensor increases, the resolution of the sensor improves. However, as the number of pixels increases, the size of the sensor increases, unless the pixel pitch is reduced. The present disclosure is directed to an infrared sensor having a high-resolution with a reduced pixel pitch, such as 10 microns or less.

The present disclosure is directed to an infrared sensor that includes a plurality of pairs of support structures positioned on the substrate, each pair including a first support structure adjacent to a second support structure. The sensor includes plurality of pixels, where each pixel is associated with one of the pairs of support structures. Each pixel includes a first infrared reflector layer on the substrate between the first and the second support structures, a membrane formed on the first and second support structures, a thermally conductive resistive layer on the membrane and positioned above the first infrared reflector layer, a second infrared reflector layer on the resistive layer, and an infrared absorption layer on the second infrared reflector layer.

BRIEF DESCRIPTION OF THE SEVERAL VIEWS OF THE DRAWINGS

FIG. 4A is a cross-sectional view of the array of FIG. 3 along the cross-section line A-A;

FIG. 4B is a cross-sectional view of the array of FIG. 3 along the cross-section line B-B;

FIG. 4C is a cross-sectional view of the array of FIG. 3 along the cross-section line C-C;

FIG. 4D is a cross-sectional view of the array of FIG. 3 along the cross-section line D-D;

FIG. 4E is a cross-sectional view of the array of FIG. 3 along the cross-section line E-E;

FIGS. 5A-13B and 5B-13B are a series of manufacturing steps to form the array of FIG. 3, taken along the cross-section lines A-A and B-B, respectively.

DETAILED DESCRIPTION

Figure 1:
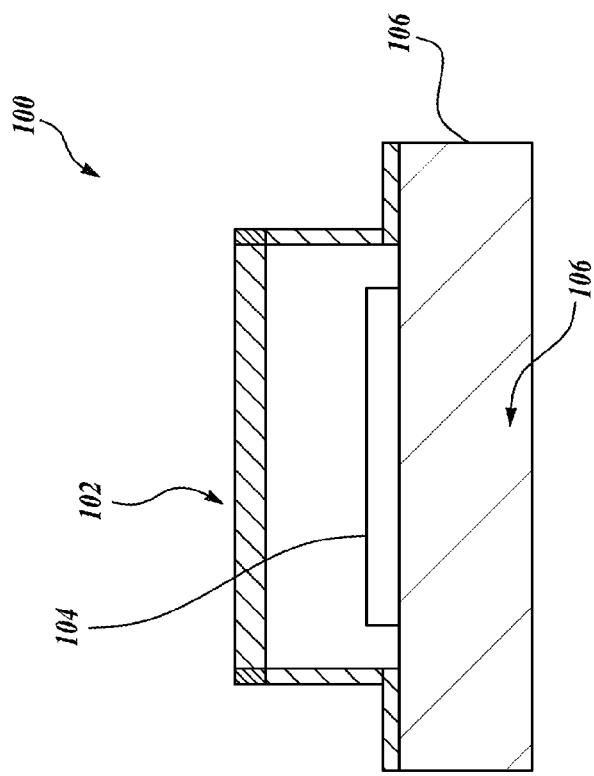
FIG. 1 is a known microbolometer arrangement.

In the following description, certain specific details are set forth in order to provide a thorough understanding of various embodiments of the disclosure. However, one skilled in the art will understand that the disclosure may be practiced without these specific details. In some instances, well-known structures associated with semiconductor manufacturing have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale, but in many instances, do reflect actual scale and relative size between the components.

Figure 2:
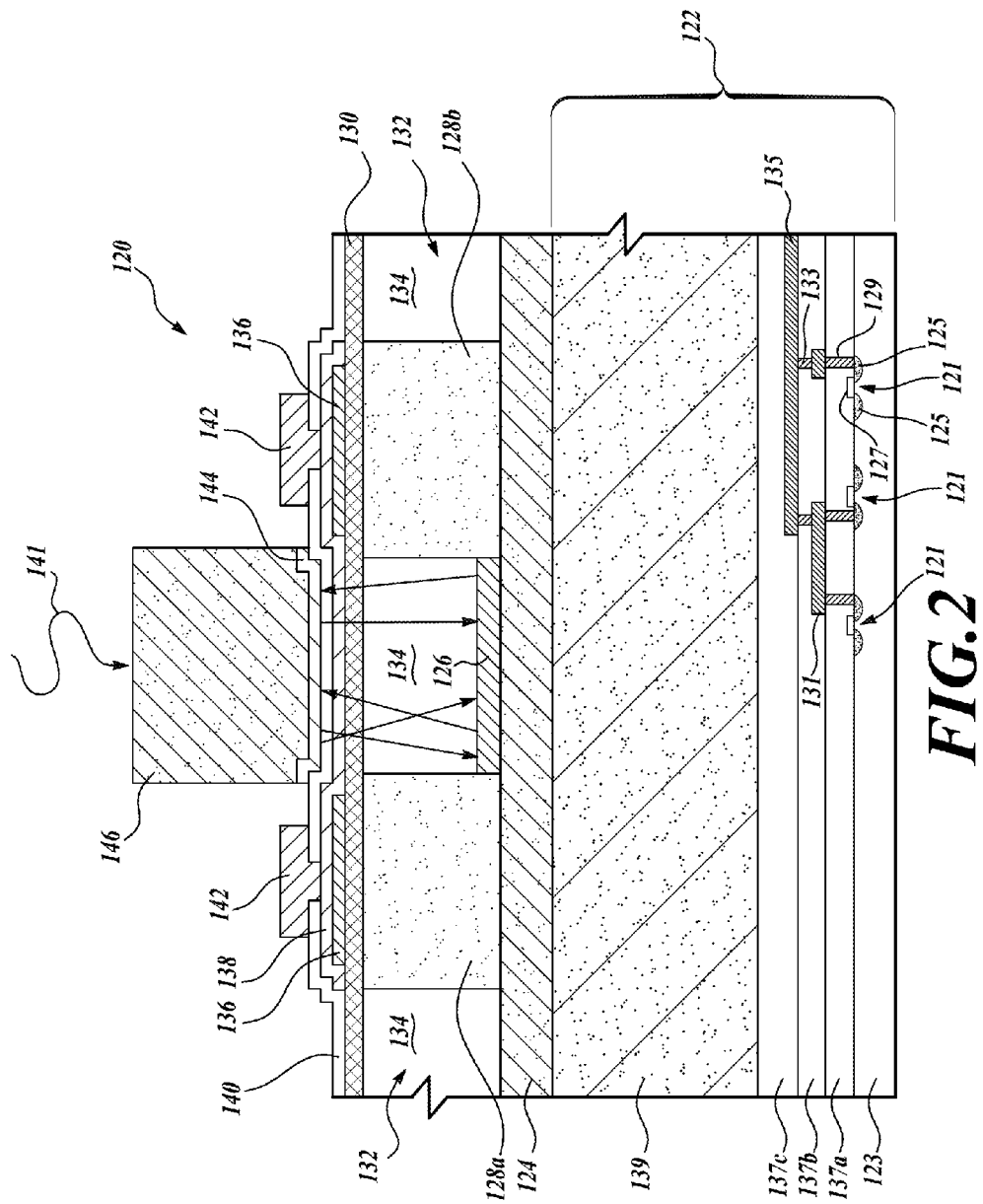
FIG. 2 is a cross-sectional view of a pixel from an infrared sensor according to an embodiment of the present disclosure.

FIG. 2 is a cross-sectional view of a single pixel 120 formed in accordance with the present disclosure. As will be described in more detail below, an infrared array is formed of a plurality of the pixels 120, which are spaced by a small pixel pitch. The method of forming an infrared sensor array, such as a microbolometer, described in this disclosure can form an array having hundreds of thousands to millions of pixels having a pixel pitch of 10-15 microns. For example, this method can form an array of 1 million pixels with a 15 micrometer pixel pitch. However, this same method can form advanced sensors for smaller applications, such as 16×16 pixel arrays in very small packages for use with presence detection. Other embodiments envision a sensor with 64×64 pixel arrays for presence detection. As the number of pixels increases, the resolution and specificity of the information gathered by the sensor increases. Having more pixels with a small pixel pitch increases the resolution of the infrared sensor, which in turn increases the sensitivity of the outputted images. This increases the applications in which a high-resolution infrared sensor will be beneficial.

The pixel 120 includes a first reflective layer 126 that is separated from a second reflective layer 144 by air 134, a transparent membrane 130, a resistive layer 138, and a dielectric layer 140. When a photon 141 interacts with an absorptive material 146 positioned on top of the second reflective layer 144, the photon passes through the resistive layer 138 and bounces back and forth between the first and second reflective layers 126, 144. Every time the photon or electromagnetic energy passes through the resistive layer 138, the resistive layer changes temperature. This change in temperature can be used to detect the amount of electromagnetic energy that is associated with the pixel, which in turn can be output as part of an image for a high resolution representation of the temperature profile of an environment.

The pixel 120 is formed on and above a substrate 122. The substrate may be a semiconductor wafer, such as a silicon wafer, a silicon-germanium wafer, or other semiconductor material. A semiconductor material is beneficial for various regions, including, but not limited to, including active circuitry in the substrate, which allows the active circuitry and the pixel array to be included in a single die.

If a semiconductor material is used for the substrate 122, then a first dielectric layer 124 is included on the substrate 122. The first dielectric layer 124 provides a sufficient space or insulation between the first reflective layer 126 and the active circuitry formed in the substrate 122. However, in some circumstances the first dielectric layer 124 may be omitted. For example, if the substrate is glass, then the first dielectric layer 124 may be omitted.

In FIG. 2, the substrate 122 includes a plurality of transistors 121 formed in and on a semiconductor material 123. Each of the transistors 121 includes source/drain regions 125 in the material 123 and a gate 127. First conductive vias 129 couple the source/drain regions 125 to a first interconnect layer 131 and second conductive vias 133 couple the first interconnect layer 131 to a second interconnect layer 135. Dielectric layers 137a, 137b, 137c separate the conductive features from each other. Additional conductive layers and dielectric layers may be included to complete the active circuitry associated with the infrared sensor. For example, the active circuitry may be a controller that is configured to operate the infrared sensor, collect the information sensed, and transmit the information to an external device.

A third dielectric layer 139 is formed above the dielectric layer 137. The third dielectric layer 139 may include additional conductive layers and elements of the active circuitry, which are not positioned directly below the infrared sensor. Alternately, the dielectric layers 137 may be a thick spacer to separate the active circuitry from the infrared sensor. The infrared sensor detects a photon by a change in temperature of a resistive layer, thus thermally separating the heat generated by the active circuitry from the infrared sensor can improve the accuracy of the sensor.

In the pixel 120, the first reflective layer is formed on the substrate between a first anchor 128a and a second anchor 128b. The membrane 130 is formed on top of the anchors 128a, 128b. The membrane 130 forms a chamber 132 formed from a plurality of integrated cavities 134.

A first conductive layer 136 is formed on the membrane 130, positioned above the anchors 128a, 128b. In the array of pixels, the first conductive layer 136 may correspond to an electrical connection for a row or a column of the array, such that electrical signals indicating a detection of a photon are transmitted by the first conductive layer 136.

The resistive layer 138 is formed on the first conductive layer 136 and the second dielectric layer 140 is formed on the resistive layer 138. A second conductive layer 142 is formed on the second dielectric layer 140 positioned above the anchors 128a, 128b. The majority of the layers are positioned above the anchors so that the anchors provide the support to maintain the position of the layers of conductive, resistive, and dielectric materials. The second conductive layer 142 runs orthogonally to the first conductive layer in that if the first conductive layer is a row electrical connection, the second conductive layer is a column electrical connection.

Figure 3:
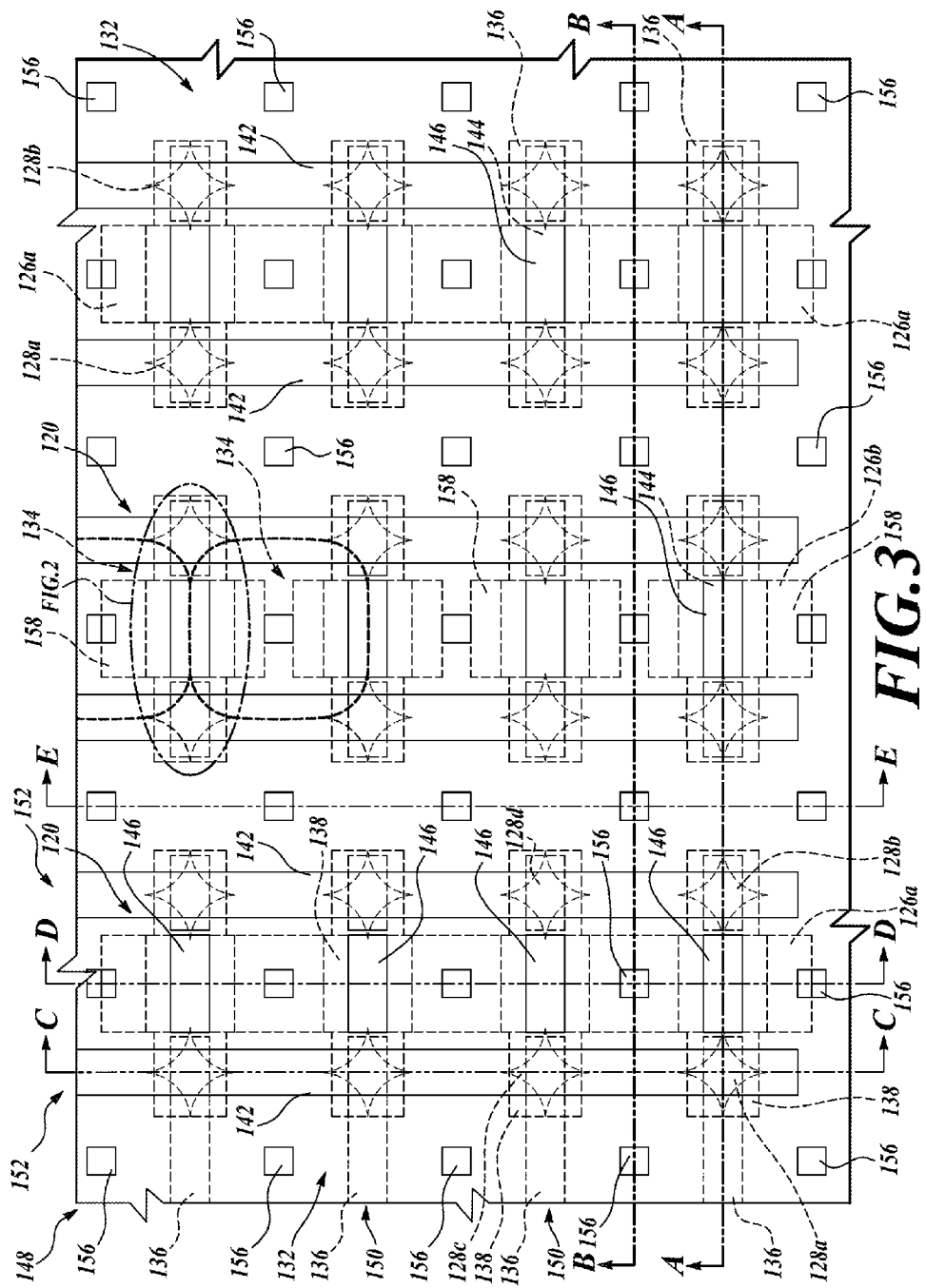
FIG. 3 is a top down view of an array of pixels of an infrared sensor according to an embodiment of the present disclosure.

FIG. 3 is a top down view of a portion of an array 148 of a plurality of the pixels 120 described above. Each pixel 120 is positioned between a pair of anchors 128a, 128b along a same row 150 as shown in FIG. 3. In other embodiments, the pixels may be arranged between a pair anchors in a same column 152, such as between anchors 128a and 128c. In this embodiment, every anchor 128 is associated with a pixel 120; however, the arrangement of the pixels with respect to pairs of anchors may be staggered or some rows or columns of anchors may not be utilized for pixel formation.

The anchors 128 are diamond shaped from a top down view, which is the result of an etching step that removes portions of a support material 154, see FIGS. 7A-13B below. The support material 154 is etched through openings 156, which are evenly spaced, positioned between the anchors, and shifted with respect to the rows. A center of each opening 156 is centrally positioned with respect to four anchors surrounding the opening 156, see anchors 128a, 128b, 128c, and 128d. The openings 156 are square shaped openings through the membrane 130. As the support material 154 is etched, a cavity 134 is formed beneath the opening. The etching is carried out until adjacent cavities 134 blend together to form the chamber 132. The shape of the openings affects the shape of the anchors. A process of forming the anchors will be described in more detail below.

The cavities have a square shape with rounded corners; see the dashed line representing a cavity 134. Boundaries of each cavity are shared with a top, right, bottom, and left boundary of adjacent cavities.

The first conductive layer 136, which aligns with the rows 150, extends from a left-most side of the Figure and overlaps with the anchor 128a in the left-most column of anchors. The first conductive layer 136 is horizontally positioned in this Figure such that the different rows of the first conductive layer 136 do not interact with each other.

The first conductive layer 136 is separated into horizontally arranged segments positioned on top of each of the anchors 128 in a row 150. In this embodiment, the segments are rectangular with their longest side being horizontal. The intersection of the various layers of each pixel is positioned above the anchors so that the anchors bear the weight of the plurality of layers.

The first reflective layer 126 is arranged with its length in a vertical orientation and is positioned between pairs of anchors in adjacent columns 152. The first reflective layer 126 is aligned with the plurality of openings 156. For example, the left-most first reflective layer 126a and the right-most first reflective layer 126b are each a single elongated rectangular layer associated with 4 pixels. A center line of the left-most first reflective layer 126a and the right-most first reflective layer 126b aligns with the center of the openings 156 associated with the 4 pixels. From the top down view, the left-most first reflective layer 126a and the right-most first reflective layer 126b are between the pairs of anchors 128 for each pixel 120.

The first reflective layer 126b positioned between the left-most first reflective layer 126a and the right-most first reflective layer 126a is separated into a plurality of rectangular sections 158. In some embodiments, it is preferable to separate the first reflective layer 126b into sections associated with each pixel. For example, separating the first reflective layer 126b into sections can further thermally isolate the pixels.

The second reflective layer 144 is a single size for each pixel 120 and has a same surface area as the absorptive material 146. Accordingly, from the top down view, a boundary of the second reflective layer 144 is not visible and only the solid line of the boundary of the absorptive material 146 can be seen.

The resistive layer 138 extends horizontally between the pair of anchors 128 for each of the pixels 120. The resistive layer 138 is above the first conductive layer 136; however, it may be positioned below the first conductive layer 136 in other embodiments. The resistive layer 138 is shown as wider than the first conductive layer 136 because the resistive layer 138 is a thin film resistor, which can be coupled to the first conductive layer 136 by direct contact. In order to increase the amount of surface area in direct contact, the resistive layer can be formed to cover the top and sides of the first conductive layer. FIGS. 2 and 4A show this overlap in more detail.

The second conductive layer 142 runs vertically in FIG. 3, positioned above each column of anchors 128. The second conductive layer 142 is the upper-most layer of the plurality of layers and is shown as a solid line. A dielectric layer (not shown) may be included in the final product to protect the conductive layer from an environment in which the sensor is placed.

FIGS. 4A, 4B, 4C, 4D, and 4E are different cross-sectional views of the array 148 taken through cross-section lines A-A, B-B, C-C, D-D, and E-E, respectively.

In FIG. 4A, cross-section line A-A passes through three pixels 120 in the same row 150. The pixels have the same elements as the pixel described in FIG. 2. In FIG. 4B, cross-section line B-B passes through the plurality of openings 156 positioned between the bottom-most rows 150 of the array in FIG. 3. A breadth of the chamber 132 is apparent from this view. In addition, the suspended portions of the membrane 130 are visible. The left-most and right-most portions of the first conductive layer 126a, 126a are present in this cross-sectional view because they are single elongated rectangles shared by pixels in a same column 152. However, the center portion of the first conductive layer 126b is not visible because the cross-section line passes between two adjacent sections of the center portion of the first conductive layer 126b. The second conductive layer 142 is positioned on the membrane between adjacent openings 156.

In FIG. 4C, the cross-section line C-C passes through the left-most column of anchors, i.e., the left-most anchor of each pair of pixels 120. The membrane 130 is formed on the support material before the anchors 128 are formed, such that once formed, the membrane is supported by the anchors and suspended above the cavities 134 between the anchors.

The first conductive layer 136 is formed on the membrane, directly above the anchor 128. The overlapping resistive layer 138 is formed on the top and sides of the first conductive layer 136. As mentioned above, this can enhance the electrical conductivity between the resistive layer 138 and the first conductive layer. In particular, the resistive layer 138 may be a thin film material that is significantly thinner than the first conductive layer. Although not shown in the Figures, the first conductive layer can be formed from a barrier layer and a metal layer formed on the barrier layer. For example, the barrier layer may be a 500 to 1,000 angstrom layer of titanium and the metal layer may be aluminum, an aluminum copper alloy, or copper. The resistive layer can be as thin as the barrier layer or less. The resistive layer should be thin in order to have the photon easily and repeatedly pass through the resistive layer as it is reflected between the two reflective layers.

The second dielectric layer 140 is formed over all of the layers, including over the membrane 130. Then, the second conductive layer 142 is formed on above the second dielectric layer 140. An opening 160 is formed through the second dielectric layer 140 to provide an electrical connection to the resistive layer and the first conductive layer 136.

In FIG. 4D, the cross-section line D-D passes through the center of the openings 156 and a center of each pixel 120 along the left-most first reflective layer 126a. The absorptive material 146 is a column of material that stands alone for each pixel. A width 162 of the absorptive material 146 is narrower than a length 164, see FIG. 4A; however, in other embodiments, the width and length may be closer in size or the width may be larger than the length.

A center of the pixel passes through the most open portion of the chamber 132, such that no anchors are visible. In addition, the arrangement of the first reflective layer 126a with respect to the resistive layer 138 and the second reflective layer 144 is easily seen. The second dielectric layer 140 and the membrane 130 are transparent dielectric materials that allow a photon to pass through.

In FIG. 4E, the cross-section line E-E passes through the plurality of openings positioned between adjacent pixels in a vertical direction, along the column 152. In this portion of the array, the membrane 130 is suspended and does not have any layers on top of it, other than the second dielectric 140.

The arrangement of the anchors 128 and the openings 156 provide a large supported area, such that the membrane 130 and the chamber 132 span a large area. For example, the area of the chamber and the pixels may be 500 microns by 500 microns. Increasing the area of the array can increase the sensitivity of the sensor. The support layer is removed in a controlled process that forms the semi-suspended membrane 130; semi-suspended because the anchors are evenly spaced at regular intervals beneath the membrane. In addition, a height of the chamber 132 may be greater than 4 microns as a result of the intervals of support provided by the anchors 128.

FIGS. 5A-13B are a series of manufacturing steps to form the infrared sensor of FIG. 3 according to an embodiment of the present disclosure. For each manufacturing step, two cross-sectional views are presented. For example, FIGS. 5A and 5B are two different cross-sectional views taken along A-A and B-B of FIG. 3.

As described above, the substrate 122 may be glass or a semiconductor material. Active circuitry may be included in the substrate 122 and formed prior to forming the sensor components. The materials and temperatures used to form the sensor components are compatible with the temperature constraints of active circuitry. For example, the temperature used to form the sensor components remain low, such as 250 degrees Celsius and lower. Such low temperatures are beneficial, because in active circuitry, designers want to reduce or prohibit the movement of the dopants formed in the substrate after forming of the active circuitry.

In FIGS. 5A and 5B, the first dielectric layer 124 is formed on the substrate 122 to electrically and thermally isolate the substrate from the sensor components. In one embodiment, the first dielectric layer 124 is silicon nitride or silicon dioxide. To achieve thermal isolation, the first dielectric layer 124 may be 5 to 10 microns thick. In other embodiments, the first dielectric layer 124 may be omitted.

A first reflective material 166 is deposited or otherwise formed on the first dielectric layer 124 and covers the entire wafer. A first mask 164 provides the dimensions to form the first reflective layer 126. An etch or other removal step removes excess portions of the first reflective material 166 to form the first reflective layer 126, including the sections 126a, 126b, see FIGS. 6A and 6B. As mentioned above, the reflective layer 126 can be a single layer beneath multiple pixels or can be a plurality of isolated sections associated with individual pixels. The first reflective layer 126 may be tantalum aluminum, aluminum, gold, or other suitably reflective material that can be formed as a very thin layer with good reflective properties. The reflective layer may be 0.1 microns in thickness. The reflective layer 126 has a high infrared spectrum reflectivity.

The support material 154 is formed on top of the first reflective layer 126 to a thickness 168 that will correspond to a height 170 of the chamber 132, see FIGS. 7A and 13B. In one embodiment, the thickness 168 will be in the range of 1.8 and 2.4 microns. However, this process can be used to form chambers with greater dimensions, such as 3 to 4 microns in height. In a preferred embodiment, the support material 154 is polyimide, which can be manipulated to form the anchors 128 at low temperatures conducive for use with active circuitry on the same wafer. Polyimide has a low thermal conductivity, similar to air. Other materials may be used that have a low thermal conductivity. The low thermal conductivity is beneficial in that the resistive layer 138 is responsive to changes in temperature. In order to optimize operation of the sensor, materials that have a low thermal conductivity are used surrounding the resistive layer 128 to reduce the thermal effects from elements other than the photons.

As shown in FIGS. 7A and 7B, the membrane 130 is formed on the support material 154. The membrane is silicon nitride, silicon dioxide, or some other transparent, dielectric material. Since the photon passes through the membrane 130 during use, the membrane material is a passive material, such that it does not affect the path of the photon. The membrane 130 may be 0.5 microns in thickness. A first conductive material 172 is formed on the membrane and corresponds to the first conductive layer 136 to be formed.

A second mask 174 provides the dimensions of the first conductive layer 136, such that portions of the first conductive material 172 are removed. FIG. 7A, includes multiple portions of the mask 174 because the first conductive layer 136 has a generally horizontal path that corresponds to the rows 150 of the array in FIG. 3. In addition, the first conductive layer 136 is formed to be positioned above the anchors, so that the anchors support the plurality of layers that make up the sensor. Accordingly, there is no mask 174 in FIG. 7B, which corresponds to where the openings 156 will be formed.

The first conductive layer 136 may include a barrier layer (not shown), such as titanium tungsten, and a metal layer on the barrier layer. The metal layer may be aluminum silicon copper at 0.5 microns in thickness. Other combinations of metal or conductive materials may be used.

In FIGS. 8A and 8B, the remaining portions of the first conductive material form the first conductive layer 136. A resistive material 176 is formed on top of the whole wafer and covers the first conductive layer 136. The resistive material 176 may be chromium silicon or other resistive material that has a high temperature coefficient of resistance and can be formed as a thin film resistor. In addition, the resistive material may be a combination of layers, such as a chromium silicon deposition of 20 nanometers covered by a silicon nitride deposition of 300 nanometers. The resistive layer 176 may be formed in accordance with methods described in U.S. Pat. Nos. 8,400,257 and 8,436,426, which are incorporated by reference in their entirety. The resistive material changes its resistance as the temperature changes and the temperature is increased as photons pass through the material.

FIG. 8B does not include any portions of the third mask 178 because the resistive layer 138 is only formed along the rows 150 and not between the rows. The resistive layer 138 is positioned above the anchors in the final sensor. The third mask 178 has dimensions that allow for the resistive layer 138 to cover top and side surfaces of the first conductive layer 136; however, the resistive layer 138 may interact with the first conductive layer 136 in other ways. For example, the resistive layer may be formed prior to forming the first conductive layer or the resistive layer may only be in contact with a top surface and one side surface of the first conductive layer.

In FIGS. 9A and 9B, the resistive layer 138 is formed on top of the first conductive layer 136. The second dielectric layer 140 is formed overlying all of the resistive layer 138, the first conductive layer and the membrane 130. The second dielectric layer 140 is a very thin, highly thermally conductive material, such as silicon nitride. A fourth mask 180 covers most of the wafer and is configured to create the openings 160 through the second dielectric layer 140 to connect the second conductive layer to the resistive layer 138.

In FIGS. 10A and 10B, a second conductive material 182 is formed over the whole wafer and in the openings 160. A fifth mask 184 defines the boundaries of the second conductive layer 142. The fifth mask 184 is visible in both FIGS. 10A and 10B because the second conductive layer 142 is vertically oriented with respect to the columns 152.

The second conductive layer 142 may be a single metal layer or a combination of conductive layers. For example, the second conductive layer may include a barrier layer with a metal layer on the barrier layer. The barrier layer may be titanium tungsten and the metal layer may be aluminum silicon copper.

In FIGS. 11A and 11B, the second conductive layer 142 remains, running perpendicular or orthogonal to the first conductive layer 136. A second reflective material 186 is formed on top of the wafer, followed by a thick infrared absorption material 188. The second reflective layer is preferably titanium nitride, but can be any suitable reflective material. In one embodiment, the titanium nitride layer will have a resistance of 377 ohms/square. In alternative embodiments, the second reflective layer may be aluminum. The second reflective layer is selected to create total internal reflection, such that the traveling photon bounces or reflects back and forth between the first and second reflective layer. Total internal reflection occurs if the refractive index of the absorptive material is lower than the reflective layer and the incident angle is greater than the critical angle. When these criteria are met, the photon cannot pass through and is entirely reflected.

The absorption material 188 is an infrared capture material that does not dissipate or scatter any of the infrared information. Silicon nitride is a high infrared absorption dielectric suitable for the absorption material 188. A thickness of the absorption material 188 may be 1 micron.

A sixth mask 190 provides the dimensions for the absorptive material 146 and the second reflective layer 144. FIG. 12A includes the absorptive material 146 and the second reflective layer 144 after removal of excess portions of the absorption material 188 and the second reflective material 186.

In FIGS. 12A and 12B, a seventh mask 192 is formed to provide the positioning for the openings 156. In FIGS. 13A and 13B, the mask 192 has been removed and the openings 156 have been formed. The process of forming the anchors 128 has begun, such that a portion of the support material 154 has been removed through the openings 156. Because FIGS. 13A and 13B are at an intermediate stage of the etching process, the support layer in FIG. 13A is still intact; however, as the etching process continues, the support material 154 will begin to separate to form the diamond shaped anchors as shown in FIG. 3 and FIG. 4A.

This method of forming an infrared sensor allows a pitch between pixels to be decreased to be below 10 microns, down to 2 microns. For example, a distance between two adjacent anchors along the row or column (horizontal or vertical) direction may be 5 microns, such that the resistive layer is at least 5 microns. The larger the surface area of the resistive layer, the more photons may pass through and increase the sensitivity of the sensor. Sensors having millions of pixels may be formed on a 1 cm$^2$ substrate.

This arrangement also allows for the temperature to be increased on the resistive layer while minimizing temperature changes elsewhere. This reduces noise caused by photons and temperature changes. By minimizing thermal propagation, the sensitivity and accuracy of the sensor are enhanced. The thermal isolation is enhanced by having air and the low thermal conductivity anchors separating the pixels. In addition, the reflection between the two reflective layers increases sensor sensitivity, while keeping the overall size small.

Figure 14:
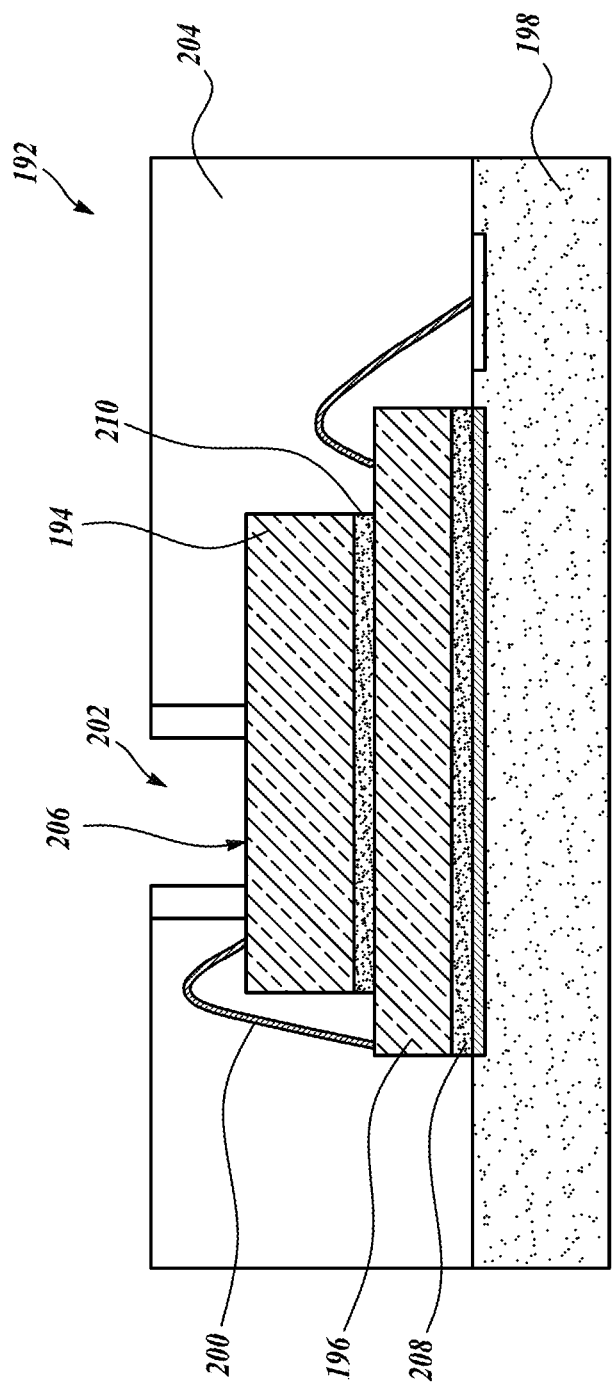
FIG. 14 is a package that includes a die having an infrared sensor positioned on an ASIC.

FIG. 14 is a cross-sectional view through a package 192 that includes an infrared sensor 194 on an ASIC 196. The ASIC is adhered to or otherwise bonded with a package substrate 198 via a bonding material 208. Additional bonding material 210 adheres or otherwise bonds the ASIC to the sensor 194. Wires 200 couple the sensor 194 to the ASIC 196. An opening 202 is formed through encapsulation material 204 of the package 192 to expose a sensing surface 206 of the infrared sensor to an environment. The sensing surface 206 includes a plurality of the pixels 120 formed in an array.

The number of wires to couple the sensor to the ASIC will depend on the number of rows and columns, which is related to sensor resolution.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a membrane above the substrate;
   a single chamber having a plurality of integrated cavities;
   a plurality of support structures between the membrane and the substrate, the support structures positioned between adjacent cavities;
   an array of infrared sensor cells on the substrate, each cell positioned at boundaries between adjacent cavities, each cell including:
      a first infrared reflector layer on the substrate between two of the support structures;
      a thermally conductive resistive layer on the membrane and positioned above the first infrared reflector layer;
      a second infrared reflector layer on the resistive layer; and
      an infrared absorption layer on the resistive layer.

2. The device of claim 1 wherein the first infrared reflector layer is separated from the resistive layer by air that corresponds to one of the boundaries between two of the cavities.

3. The device of claim 1 wherein the membrane includes a plurality of openings, each opening being positioned above a central location of one of the cavities.

4. The device of claim 1 wherein each cell includes:
   a first conductive layer on the membrane and configured to transmit a row signal, the resistive layer overlaps the first conductive layer above a first one and above a second one of the support structures; and
   a second conductive layer on the resistive layer and configured to transmit a column signal, the second conductive layer overlaps the resistive layer and the first conductive layer above the first one and above the second one of the support structures.

5. The device of claim 4 wherein the second infrared reflector layer and the infrared absorption layer have a same surface area and are positioned between the first one of the support structures and the second one of the support structures.

6. An infrared sensor, comprising:
   a substrate;
   a plurality of pairs of support structures positioned on the substrate, each pair including a first support structure adjacent to a second support structure;
   a plurality of pixels, each pixel associated with one of the pairs of support structures, each pixel including:
      a first infrared reflector layer on the substrate between the first and the second support structures;
      a membrane formed on the first and second support structures;
      a thermally conductive resistive layer on the membrane and positioned above the first infrared reflector layer;
      a second infrared reflector layer on the resistive layer; and
      an infrared absorption layer on the second infrared reflector layer.

7. The sensor of claim 6 wherein the plurality of support structures are separated from each other by a plurality of integrated cavities that form a single chamber.

8. The sensor of claim 6 wherein each pixel further includes:
   a first conductive layer formed on the membrane, between the resistive layer and the membrane; and
   a second conductive layer formed on the resistive layer.

9. The sensor of claim 8 wherein the membrane, the first conductive layer, the resistive layer, and the second conductive layer are stacked above the first support structure and the second support structure.

10. The sensor of claim 9 wherein the membrane and the resistive layer extend between the first and second support structure and are suspended above the first reflective layer.

* * * * *